US012731755B2

(12) United States Patent
Nagahara et al.

(10) Patent No.: US 12,731,755 B2
(45) Date of Patent: Sep. 8, 2026

(54) FOCUSED ION BEAM DEVICE

(71) Applicant: HITACHI HIGH-TECH ANALYSIS CORPORATION, Tokyo (JP)

(72) Inventors: Koji Nagahara, Tokyo (JP); Hiroshi Oba, Tokyo (JP); Yasuhiko Sugiyama, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 310 days.

(21) Appl. No.: 18/687,706

(22) PCT Filed: Sep. 1, 2021

(86) PCT No.: PCT/JP2021/032130
§ 371 (c)(1),
(2) Date: Feb. 28, 2024

(87) PCT Pub. No.: WO2023/032078
PCT Pub. Date: Mar. 9, 2023

(65) Prior Publication Data

US 2024/0355574 A1 Oct. 24, 2024

(51) Int. Cl.
*H01J 37/09* (2006.01)
*H01J 37/305* (2006.01)
(Continued)

(52) U.S. Cl.
CPC .......... *H01J 37/09* (2013.01); *H01J 37/3056* (2013.01); *H01J 37/08* (2013.01); *H01J 37/28* (2013.01); *H01J 2237/31749* (2013.01)

(58) Field of Classification Search
CPC .. H01J 37/09; H01J 37/00; H01J 37/02; H01J 37/3056; H01J 37/28; H01J 37/305; H01J 2237/31749; H01J 2237/0458
(Continued)

(56) References Cited

U.S. PATENT DOCUMENTS

2007/0257207 A1* 11/2007 Frosien .................. H01J 37/09 250/492.3
2008/0230694 A1* 9/2008 Frosien .................. H01J 37/12 250/398
(Continued)

FOREIGN PATENT DOCUMENTS

JP 8-162389 6/1996
JP 9-162098 6/1997
(Continued)

*Primary Examiner* — Jason L Mccormack
(74) *Attorney, Agent, or Firm* — Holland & Hart LLP

(57) ABSTRACT

An ion beam tube of a composite beam device is provided with an ion source and an ion optics. The ion optics is provided with a diaphragm member in which at least one through-hole that is switchable in order to pass part of an ion beam generated from the ion source therethrough is formed. The ion optics is provided with a blocking member that blocks part of the ion beam passing through the through-hole of the diaphragm member, and a blocking drive mechanism that drives the blocking member. The blocking drive mechanism performs switching between the presence and absence of blocking of the ion beam passing through the through-hole of the diaphragm member by the blocking member in a state where the ion optics maintains a predetermined optical condition.

8 Claims, 7 Drawing Sheets

(51) Int. Cl.
*H01J 37/08* (2006.01)
*H01J 37/28* (2006.01)

(58) Field of Classification Search
USPC ........................................................ 250/423 R
See application file for complete search history.

(56) References Cited

U.S. PATENT DOCUMENTS

| | | | | |
|---|---|---|---|---|
| 2009/0230299 | A1* | 9/2009 | Shichi ................. | H01J 37/3023 250/288 |
| 2012/0292535 | A1 | 11/2012 | Choi et al. | |

FOREIGN PATENT DOCUMENTS

| | | |
|---|---|---|
| JP | 2004-288810 | 10/2004 |
| JP | 2005-123196 | 5/2005 |
| JP | 2008-258149 | 10/2008 |
| JP | 2021-051892 | 4/2021 |

* cited by examiner

FOCUSED ION BEAM DEVICE

CROSS REFERENCE

The present Application for Patent is a 371 national phase filing of International Patent Application No. PCT/JP2021/032130, by NAGAHARA et al., entitled "FOCUSED ION BEAM DEVICE," filed Sep. 1, 2021, assigned to the assignee hereof, and expressly incorporated by reference herein.

TECHNICAL FIELD

The present invention relates to a focused ion beam device.

BACKGROUND ART

Conventionally, micron-level local processing may be performed using a focused ion beam (FIB) device, for example, for failure analysis of semiconductor devices. For example, a composite beam device that combines an FIB device and a scanning electron microscope (SEM) allows observation of a sample surface by using a secondary electron image and sputter processing that uses a high-energy ion beam.

With the use of these functions, specific areas of semiconductor devices are locally processed for evaluation and analysis of the cross-sectional structure or for thinning of the cross-sectional structure, followed by analysis by transmission electron microscopy. The analysis results are fed back to adjust the manufacturing process conditions for optimization of the process conditions, resulting in improvement in reliability of the end products. The present invention relates to processing for analysis using a focused ion beam device.

In the process of cross-section processing or thinning, the surface to be evaluated and analyzed needs to be processed into a vertical plane with a raised edge.

In connection with focused ion beam processing for analysis, there is known a beam system in which the optics is equipped with a mask with an aperture of a desired edge shape having a linear edge line. Due to the optics, the beam system processes a sample with a shaped beam that is cut through the mask, thereby producing the sample with a processing shape having a linear edge (see Patent Document 1).

In addition, there is known a processing observation device equipped with a mask that is placed between an ion beam column and a sample on a sample stand in a sample chamber and which blocks a portion of an ion beam directed toward the sample, so that the processing shape and position can be adjusted (see Patent Document 2).

In addition, there is known a processing device equipped with an optics provided with a mask with an aperture of a desired edge shape orthogonal to the optical axis. The processing device irradiates a sample with an ion beam in a projection mode in which a shaped beam cut through the mask matches the processing shape (see Patent Document 3).

DOCUMENT OF RELATED ART

Patent Literature

Patent Document 1: Japanese Patent Application Publication No. 2005-123196

Patent Document 2: Japanese Patent Application Publication No. 2008-258149

Patent Document 3: Japanese Patent Application Publication No. 9-162098

DISCLOSURE

Technical Field

In focused ion beam processing using a large current, the beam diameter expands due to blurring attributable to aberrations in an optics. Therefore, in cross-section processing or lamella formation processing, it is difficult to process the surface to be evaluated and analyzed to a vertical plane with steep edges. Therefore, to fabricate a plane with sharp edges, the beam current was lowered sequentially from a large current (several 10 nA), to a medium current (several nA), to a low current (several 100 pA).

However, this method is disadvantageous in terms of throughput because the method requires multiple processes performed with different beam currents.

On the other hand, the beam system and processing device disclosed in Patent Documents 1 and 3 have problems in that when an image of an observed target is generated by irradiation of a processing beam, for example, for determining the processing position, a distorted image is obtained, and the desired positioning accuracy cannot be secured. To address this problem, for example, there is an observation image generation method by switching the shapes of a mask aperture or optical conditions between observation method and processing mode.

For example, for the mask aperture switching, a mask with multiple differently shaped apertures is used. For example, during observation, the shape of the aperture of the mask is switched to a small-diameter circle or the like to generate an image (scanning image) of an observation target object by scanning the observation target object with a narrowly focused beam. However, when the shape of the mask aperture is switched between the observation mode and the processing mode, a mask with multiple apertures is required, and the accuracy and reproducibility of the beam irradiation position may deteriorate due to displacement caused by mask switching.

In addition, for example, for the optical conditions switching, the beam is switched to focusing mode (a mode in which the ion beam is almost collimated by a condenser lens and is focused on the object by an objective lens) to generate a so-called Gaussian beam, and an image (scanning image) is generated by scanning the observation target object with the beam. However, when the optical conditions are switched between the observation mode and the processing mode, the accuracy and reproducibility of the beam irradiation position may deteriorate due to lens voltage changes.

In addition, the processing observation device disclosed in Patent Document 2 has a problem in that when moving equipment such as gas supply equipment and sampling equipment such as a micromanipulator, and an objective lens of the electron beam column are placed between the sample and the ion beam column, it is difficult to place the mask without interference with other equipment.

The purpose of the present invention is to provide a focused ion beam device that can improve the positional accuracy of the processing position at which processing by an ion beam is performed.

Technical Field

In order to solve the above problem, aa focused ion beam device according to the present invention includes: an ion source that generates an ion beam; a diaphragm member having at least one through-hole which is selected to allow to pass a portion of the ion beam generated by the ion source through; a blocking member that blocks a portion of the ion beam passing through the through-hole of the diaphragm member; a drive mechanism that drives the blocking member; and an optics that irradiates a sample with the ion beam passing through the through-hole. The drive mechanism is designed to drive a switch between presence and absence of blocking of the ion beam passing through the through-hole of the diaphragm member by the blocking member in a state in which the optics maintains a predetermined optical condition.

In the construction, the drive mechanism may drive switch between presence and absence of blocking of the ion beam passing through the through-hole arranged at a central portion of the ion beam by the blocking member.

In the construction, the drive mechanism, in case the ion beam passing through the through-hole is blocked by an end of the blocking member, places the end of the blocking member at a central portion of the ion beam.

In the construction, the outer shape of the through-hole of the diaphragm member may be a circular shape, the blocking member may be provided with a linear edge-shaped end, and the drive mechanism may switch a cross sectional shape of the ion beam with respect to a beam axis between an arched or semi-circular shape and a circular shape by driving a switch between presence and absence of blocking of the ion beam passing through the through-hole by the end.

In the construction, the drive mechanism may drive a switch between presence and absence of blocking of the ion beam passing through the through-hole by each of both ends in a driving direction by driving the blocking member in at least one axial direction forward or backward.

Advantageous Effects

According to the present invention, due to the inclusion of the drive mechanism that performs switching between blocking and unblocking of the ion beam passing through the through-hole of the diaphragm member in a state in which the optics maintains a predetermined optical condition, it is possible to inhibit the deterioration of the positional accuracy of the beam irradiation position, which may occur when observation mode and processing mode are switched, and to improve the positional accuracy of the processing position at which the ion beam processing is performed.

DESCRIPTION OF RELATED ART

BEST MODE

Hereinafter, a composite beam device 10 according to one embodiment of the present invention will be described with reference to the accompanying drawings.

Composite Beam Device

Figure 1:
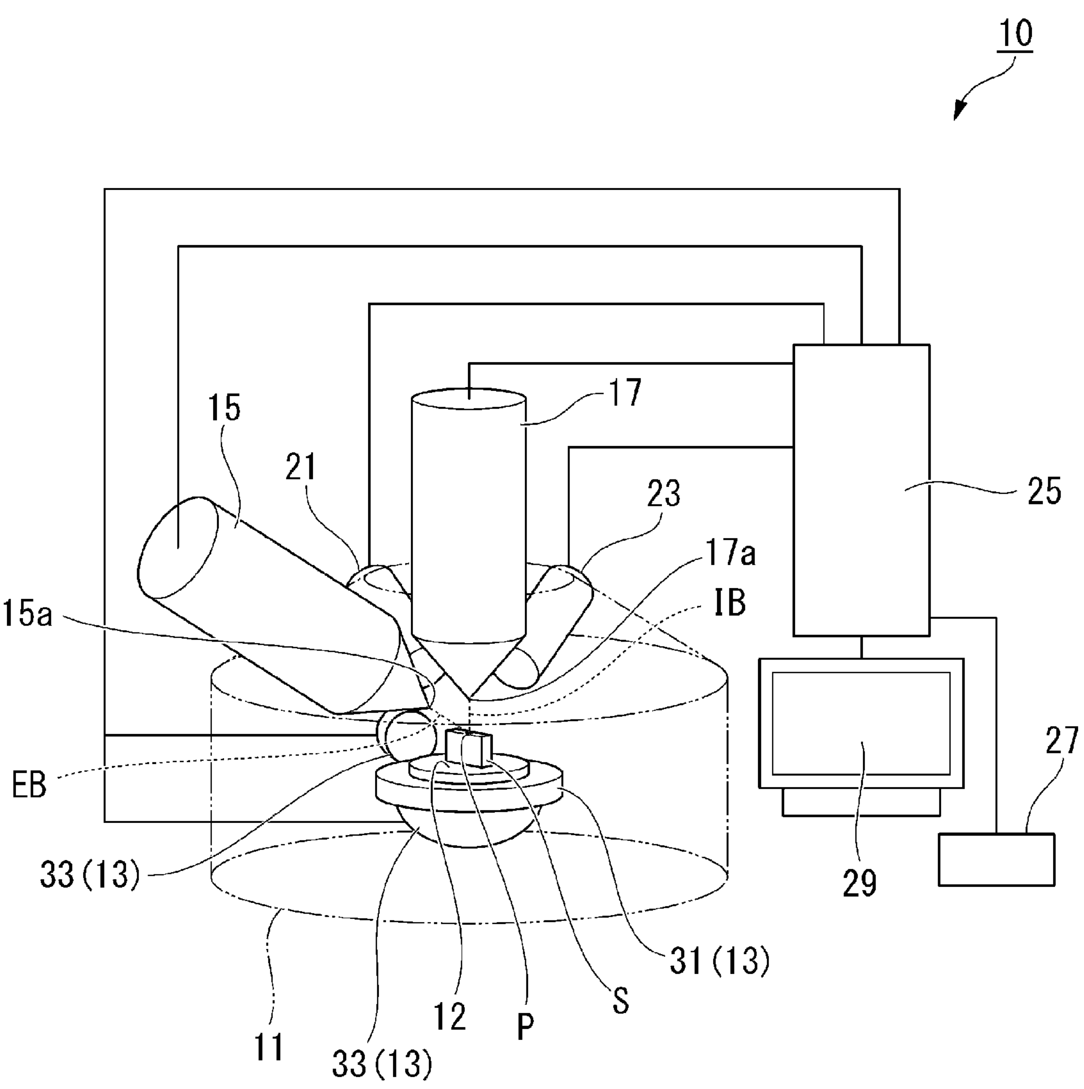
FIG. 1 is a view illustrating the construction of a composite beam device according to one embodiment of the present invention.

FIG. 1 is a view illustrating the construction of a composite beam device 10 according to one embodiment.

The composite beam device 10 includes a sample chamber 11, a sample holder 12, a sample stand 13, an electron beam column 15 and an ion beam column 17 fixed in the sample chamber 11.

However, the electron beam column 15 is not necessarily required to implement the present invention. Instead of the composite beam device 10, the present invention can be implemented with a focused ion beam device equipped with an ion beam column 17.

The composite beam device 10 is equipped with, for example, a secondary charged particle detector 21 as a detector fixed in the sample chamber 11. The composite beam system 10 is equipped with a gas supply unit 23 that supplies gas to the surface of a sample S. The composite beam device 10 is equipped with a control device 25 that collectively controls the operation of the composite beam device 10 while being disposed outside the sample chamber 11, an input device 27 and a display device 29 connected to the control device 25.

Herein, X-axis, Y-axis, and Z-axis directions, which are orthogonal to each other in 3D space, are parallel to the respective axes. For example, the Z-axis direction is parallel to the top-to-bottom direction (for example, vertical direction) of the composite beam device 10. The X-axis and Y-axis directions are parallel to a reference plane (for example, horizontal plane) that is orthogonal to the top-to-bottom direction of the composite beam system 10.

The sample chamber 11 is defined by an airtight, pressure-tight case capable of maintaining the desired reduced pressure. The sample chamber 11 can be evacuated by an air exhauster (not shown) until the interior of the sample chamber 11 has the desired reduced pressure.

The sample holder 12 fixes the sample S.

The sample stand 13 is disposed inside the sample chamber 11. The sample stand 13 includes a stage 31 that supports the sample holder 12 and a stage drive mechanism 33 that collectively three-dimensionally moves and rotates the stage 31 and the sample holder 12.

The stage drive mechanism 33 moves the stage 31 backwards and forwards along the X-axis, Y-axis, and Z-axis directions, for example. The stage drive mechanism 33, for example, rotates the stage 31 by an appropriate angle around each of the predetermined rotation and tilt axes. For example, the rotation axis is set relative to the stage 31. The stage 31 is parallel to the vertical direction of the composite beam system 10 when the stage 31 is in a predetermined reference position around the tilt axis. For example, the tilt axis is parallel to a direction perpendicular to the top-to-bottom direction (for example, vertical direction) of the composite beam device 10. The stage drive mechanism 33, for example, rotates the stage 31 eccentrically around the rotation axis and the tilt axis. The stage drive mechanism 33 is controlled by control signals that are output from the control device 25 depending on the operation mode of the composite beam system 10.

The electron beam column 15 directs an electron beam (EB) to an irradiation target within a predetermined irradiation region inside the sample chamber 11. The electron beam column 15 is positioned, for example, such that the electron beam emission end 15*a* thereof obliquely faces the stage 31 in a tilt direction that is inclined by a predetermined angle with respect to the top-to-bottom direction of the composite beam system 10. The electron beam column 15 is fixed to the sample chamber 11 such that the optical axis of the electron beam becomes parallel to the tilt direction.

The electron beam column 15 is equipped with an electron source that generates electrons and an electron optics that focuses and deflects the electrons emitted from the electron source. The electron optics is equipped with, for example, an electromagnetic lens and a deflector. The electron source and electron optics are controlled by control signals output from the control device 25 according to the electron beam irradiation position and irradiation conditions.

The ion beam column 17 directs an ion beam (IB), such as focused ion beam, at an irradiation target disposed within a predetermined irradiation region inside the sample chamber 11. The ion beam column 17, for example, is positioned such that the ion beam emission end 17*a* thereof faces the stage 31 in the top-to-bottom direction of the composite beam system 10. The ion beam column 17 is fixed to the sample chamber 11 such that the optical axis of the ion beam becomes parallel to the top-to-down direction.

The details of the ion beam column 17 according to one embodiment will be described below.

The optical axis of the electron beam column 15 and the optical axis of the ion beam column 17 intersect each other, for example, at a predetermined position P above the sample stand 13.

The relative positional arrangement of the electron beam column 15 and the ion beam column 17 may be change as appropriate. For example, the electron beam column 15 may be arranged in the vertical direction, and the ion beam column 17 may be positioned in the tilt or orthogonal direction with respect to the vertical direction.

The composite beam device 10 can perform imaging of the irradiated region, various types of processing (such as drilling and trimming processes) based on sputtering, deposition film formation, etc., by scanning the surface of the irradiation target with the ion beam. The composite beam device 10 can perform processing on the sample S to form sample pieces (for example, lamella samples and needle-shaped samples) for transmission electron microscopic observation and to form analytical sample pieces for electron beam analysis. The composite beam device 10 can process a sample piece transferred to a sample piece holder into a thin film with the desired thickness suitable for transmission electron microscopic observation. The composite beam device 10 enables observation of the surface of the irradiation target object by scanning the surface of the irradiation target object such as a sample S, a sample piece, and a needle with the ion beam or electron beam.

The secondary charged particle detector 21 detects secondary charged particles (secondary electrons and secondary ions) generated from the irradiation target object irradiated with the ion or electron beam. The secondary charged particle detector 21 is connected to the control device 25, and the detection signal output from the secondary charged particle detector 21 is transmitted to the control device 25.

The detector of the composite beam device 10 is not limited to the secondary charged particle detector 21, and the composite beam device 10 may include other types of detectors. Examples of the detector include energy dispersive X-ray spectrometer (DES) detectors, backscattered-electron detectors, and electron back-scattering diffraction (EBSD) detectors. The EDS detector detects X-rays generated from the irradiation target object irradiated with the electron beam. The backscattered-electron detector detects backscattered electrons generated from the irradiation target object irradiated with the electron beam. The EBSD detector detects am electron beam backscatter diffraction pattern generated from the irradiation target object irradiated with the electron beam. Among the secondary charged particle detectors 21, the secondary charged particle detector 21 that detects secondary electrons, and the backscattered-electron detector may be housed in the casing of the electron beam column 15.

The gas supply unit 23 is fixed to the sample chamber 11. The gas supply unit 23 is equipped with a gas injection unit (nozzle) that is positioned facing the stage 31. The gas supply unit 23 supplies etching gas, deposition gas, and the like to the irradiation target object. The etching gas selectively promotes the etching of the irradiation target object by the ion beam, depending on the material of the irradiation target object. The deposition gas forms a deposition film made of metal or insulator deposits on the surface of the irradiation target object.

The gas supply unit 23 is controlled by control signals output from the control device 25 according to the operation mode of the composite beam device 10 and other factors.

The control device 25 controls the overall operation of the composite beam device 10 by, for example, signals input through the input device 27 or signals generated by a predetermined automatic operation control process.

The control device 25 is a software functional unit that functions in a manner that a processor such as a central processing unit (CPU) executes a predetermined program. The software functional unit is an electronic control unit (ECU) equipped with an electronic circuits such as a processor such as a CPU, a read only memory (ROM) that stores programs, a random access memory (RAM) unit that temporarily stores data, and a timer. At least part of the control device 25 may be an integrated circuit (IC) such as a large scale integrated (LSI) circuit.

The input device 27 is, for example, a mouse and keyboard that outputs signals in response to input operations made by the operator.

The display device 29 displays various information of the composite beam device 10, image data generated based on signals output from the secondary charged particle detector 21, and screens for allowing operations such as zooming in, zooming out, moving, and rotating the image data.

Ion Beam Column

Figure 2:
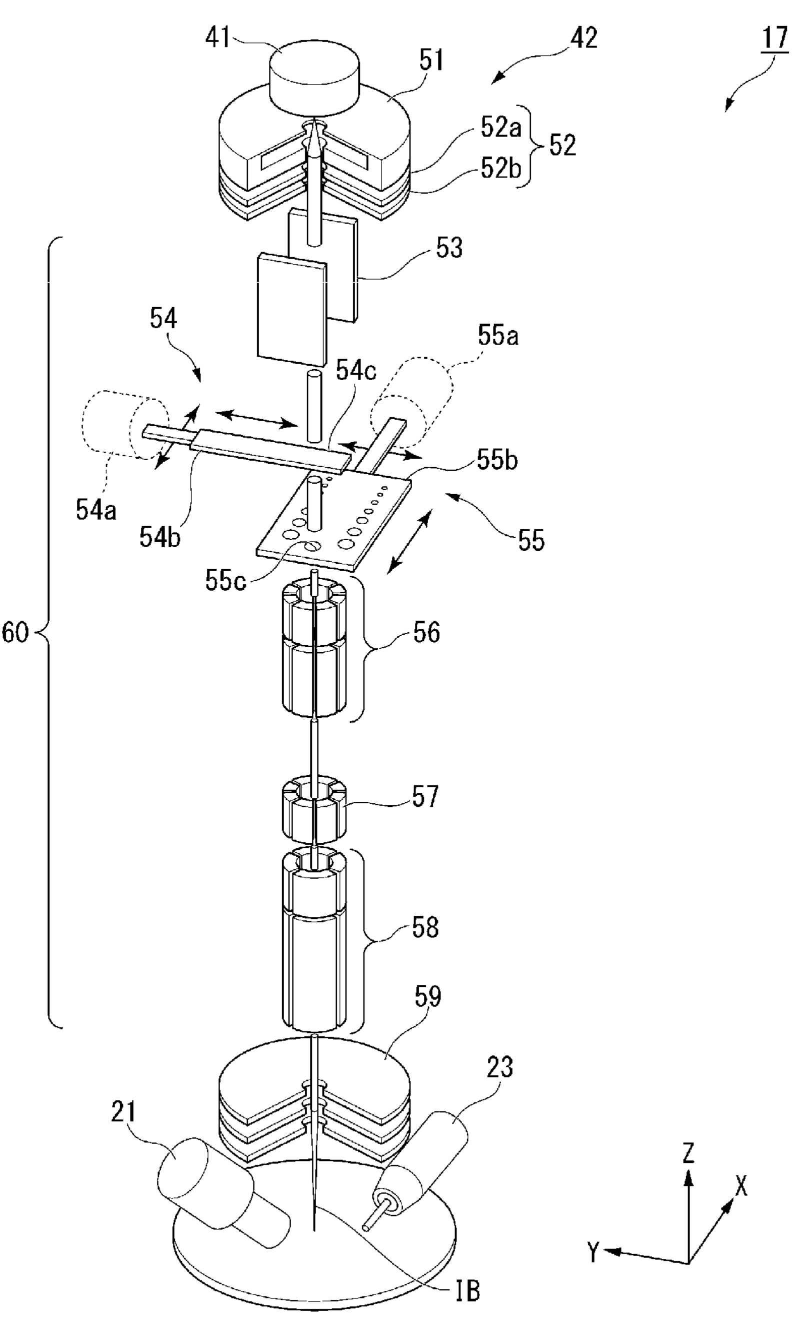
FIG. 2 is a view illustrating the construction of an ion beam column according to one embodiment of the present invention.

FIG. 2 is a view illustrating the construction of the ion beam column 17 used in one embodiment.

The ion beam column 17 includes an ion source 41 and an ion optics 42. The ion source 41 and the ion optics are controlled by control signals output from the control device 25 according to the ion beam IB irradiation position and irradiation conditions.

The ion source 41 generates ions. The ion source 41 is a liquid metal ion source using, for example, liquid gallium.

The ion source 41 may be, for example, a gas field-emission ion source or a plasma ion source using inductive coupling or electron cyclotron resonance (ECR).

The ion optics 42 focuses and deflects the ion beam extracted from the ion source 41. The ion optics 42 can switch the optical conditions to one of several modes, such as focusing mode and projection mode described below. The ion optics 42 includes an extraction electrode 51, a condenser lens 52, a blanker 53, a movable blocking unit 54, a movable diaphragm 55, an alignment 56, a stigmeter 57, a scanning electrode 58, and objective lenses 59 that are arranged in this order from the ion source 41 side to the emission end 17*a* side (i.e., sample S side) of the ion beam column 17.

The extraction electrode 51 extracts ions from the ion source 41 by means of an electric field generated between the extraction electrode and the ion source 41. The voltage applied to the extraction electrode 51 is controlled, for example, according to the desired emission current of the ion beam.

The condenser lens 52 includes, for example, a first condenser lens 52*a* and a second condenser lens 52*b* arranged along the optical axis. Each of the first and second condenser lenses 52*a* and 52*b* is, for example, an electrostatic lens equipped with three electrodes arranged along the optical axis.

The condenser lens 52 focuses the ion beam extracted from the ion source 41 by the extraction electrode 51. In the condenser lens 52, the applied voltage is adjusted according to the optical conditions of the ion beam column 17, thereby changing the lens strength related to the degree of convergence of the ion beam.

The blanker 53, alignment 56, and scanning electrode 58 constitute an electrostatic deflector 60 that deflects the ion beam, and the stigmeter 57 corrects the beam shape.

The blanker 53 is equipped with, for example, a pair of electrodes (blanking electrodes) that are positioned to face each other so as to sandwich the optical axis from both sides in a direction that intersects the traveling direction of the ion beam. The blanker 53 toggles between blocking and unblocking of the ion beam. For example, the blanker 53 blocks the ion beam by deflecting the ion beam so that the ion beam strikes a blanking aperture (not shown) and releases the blocking by not deflecting the ion beam.

The movable blocking unit 54 has a blocking drive mechanism 54*a* and a blocking member 54*b*.

The blocking drive mechanism 54*a* is controlled by control signals that are output from the control device 25 according to the operation mode of the composite beam device 10. For example, the blocking drive mechanism 54*a* has an actuator whose driving direction is at least one axial direction. The actuator is, for example, a piezoelectric actuator. The driving direction of the actuator is at least one arbitrary axial direction in the plane intersecting the optical axis of the ion beam column 17. For example, the actuator moves the blocking member 54*b* in each of the X-axis and Y-axis directions perpendicular to the optical axis of the ion beam column 17. The blocking drive mechanism 54*a* may include a motor and a gear mechanism.

The outer shape of the blocking member 54*b* is, for example, a rectangular plate shape. The outer shape of at least one end of the blocking member 54*b* in the lateral direction is a knife edge shape that extends linearly along the longitudinal direction. The blocking member 54*b* is formed, for example, of a material such as glassy carbon, which exhibits a lower sputtering rate than metals such as tungsten, or a material such as single-crystal silicon, which maintains a highly linear knife-edge shape even when etched.

The blocking member 54*b* is arranged such that the lateral direction thereof is parallel to a first driving direction (for example, X-axis direction) by the blocking drive mechanism 54*a* and the knife-edge-shaped end 54*c* extending along the longitudinal direction parallel to a second driving direction (for example, Y-axis direction) by the blocking drive mechanism 54*a*. The blocking member 54*b* is displaced in the X-axis direction by the blocking drive mechanism 54*a* to block a portion of the ion beam by an end portion 54*d* including the knife-edge-shaped end 54*c*. The blocking member 54*b* is displaced in the Y-axis direction by the blocking drive mechanism 54*a*, thereby changing an ion beam blocking portion of the end portion 54*d* including the knife-edge-shaped end 54*c* along the Y-axis direction.

For example, the blocking member 54*b* forms an ion beam whose cross-sectional shape relative to the optical axis is arched or semi-circular after the ion beam passes through the movable diaphragm 55 by preliminarily blocking a portion of the ion beam that is formed to have a circular cross-sectional shape with respect to the optical axis by the movable diaphragm 55 described below. The cross-sectional shape of the ion beam formed by the blocking member 54*b*, with respect to the optical axis, is an arch or semi-circle shape with the chord formed by the knife-edge-shaped end 54*c* and the arc that does not interfere with the blocking member 54*b*.

The movable diaphragm 55 includes a diaphragm drive mechanism 55*a* and a diaphragm member 55*b*.

The diaphragm drive mechanism 55*a* is controlled by control signals that are output from the control device 25 according to the operation mode of the composite beam device 10. For example, the diaphragm drive mechanism 55*a* includes an actuator whose driving direction is at least one axial direction. The actuator is, for example, a piezoelectric actuator. The driving direction of the actuator is at least one arbitrary axial direction in the plane intersecting the optical axis of the ion beam column 17. For example, the actuator moves the diaphragm member 55*b* in each of the X-axis and Y-axis directions perpendicular to the optical axis of the ion beam column 17. The diaphragm drive mechanism 55*a* may include a motor and a gear mechanism.

The outer shape of the diaphragm member 55*b* is, for example, a plate shape provided with at least one through-hole 55*c*. For example, the diaphragm member 55*b* has a plurality of through-holes 55*c* arranged along a predetermined direction. The predetermined direction is parallel to the driving direction of the diaphragm drive mechanism 55*a*. For example, it is the X-axis direction. Any of the multiple through-holes 55*c* allows at least a portion of the ion beam to pass through, depending on the drive of the diaphragm member 55*b* by the diaphragm drive mechanism 55*a*. The multiple through-holes 55*c* are circular holes with different sizes for at least observation and processing. Since the blocking member 54*b* and the diaphragm member 55*b* are disposed inside the ion beam column 17, interference between the blocking member 54*b* and the diaphragm member 55*b* and other components is prevented.

Each of the alignment 56, stigmeter 57, and scanning electrode 58 is composed of, for example, a plurality of electrodes or the like arranged in a cylindrical shape around the optical axis of the ion beam.

The alignment 56 adjusts the trajectory of the ion beam so that the ion beam can pass through the central axis of the objective lens 59.

The stigmeter 57 corrects astigmatism of the ion beam.

The scanning electrode 58 causes the ion beam having passed through the objective lens 59 to scan the sample S. The scanning electrode 58, for example, performs raster scanning for a rectangular area on the surface of the sample S by applying a deflection voltage for two-dimensional scanning.

The objective lens 59 is, for example, an electrostatic lens with three electrodes arranged along the optical axis. The objective lens 59 focuses the ion beam on the sample S. In the objective lens 59, the applied voltage is adjusted according to the optical conditions of the ion beam column 17, thereby changing the lens strength related to the degree of convergence of the ion beam and the size of the beam shape.

The ion optics 42 can switch the optical conditions to one of several modes, such as focusing mode and projection mode.

In the focusing mode, the ion beam trajectories do not intersect with each other but are nearly parallel with each other between the condenser lens 52 and the objective lens 59, and the angular spread of the ion beam is adjusted by the movable blocking member unit 54 and the movable diaphragm 55. In the focusing mode, the sample S is scanned by an ion beam that is focused on the sample S by the objective lens 59 and deflected by the scanning electrode 58.

The projection mode is based on the Köhler illumination method, which is the so-called uniform illumination method, and projects the ion beam, which is formed by the movable diaphragm 55 corresponding to a field stop, onto the sample S without scanning. In the projection mode, the objective lens 59 makes the movable diaphragm 55 the light source and focuses the ion beam with a beam shape cut by the movable diaphragm 55 onto the sample S. In the projection mode, scanning may be performed to expand the irradiation range or for other purposes.

The ion optics 42, for example, switches between blocking and unblocking of the ion beam by the movable blocking unit 54, in a state in which the optical conditions for the focusing mode are maintained and the selection of the through-hole 55*c* of the movable diaphragm 55 through which the ion beam passes is maintained, when the observation and processing of the sample S are performed repeatedly.

For example, the ion optics 42 first forms an ion beam with a circular cross-sectional shape relative to the optical axis by aligning the center of the desired circular hole of the movable diaphragm 55 to the beam center C (see FIGS. 3 and 4 described below) without blocking the ion beam with the movable blocking unit 54 during observation to set the processing area and to correct misalignment. The ion beam deflected by the scanning electrode 58 is made to scan over the sample S, and the secondary charged particle signals generated from the surface of the sample S are detected by the secondary charged particle detector 21 to form an observation image.

Next, during processing, the ion optics 42 forms an ion beam with an arc-shaped or semi-circular cross-sectional shape relative to the optical axis by blocking a portion of the ion beam with the movable blocking unit 54 while maintaining the same optical conditions such as lens voltage and other settings of the movable diaphragm 55 as in the case of the overvation. After that, processing is carried out.

Figure 3:
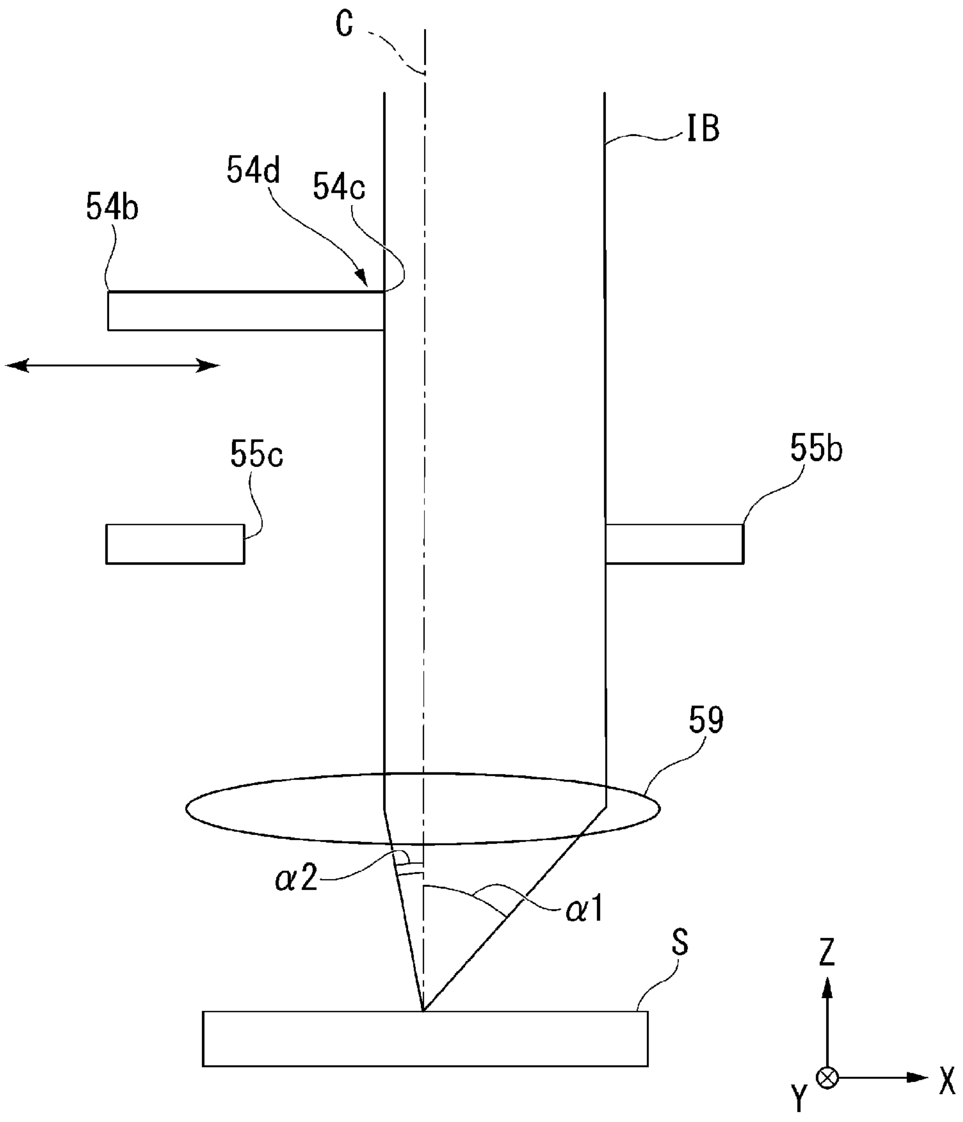
FIG. 3 is a view illustrating the correspondence between an ion beam and a shielding member and diaphragm member of the ion beam column, according to one embodiment of the present invention.
Figure 4:
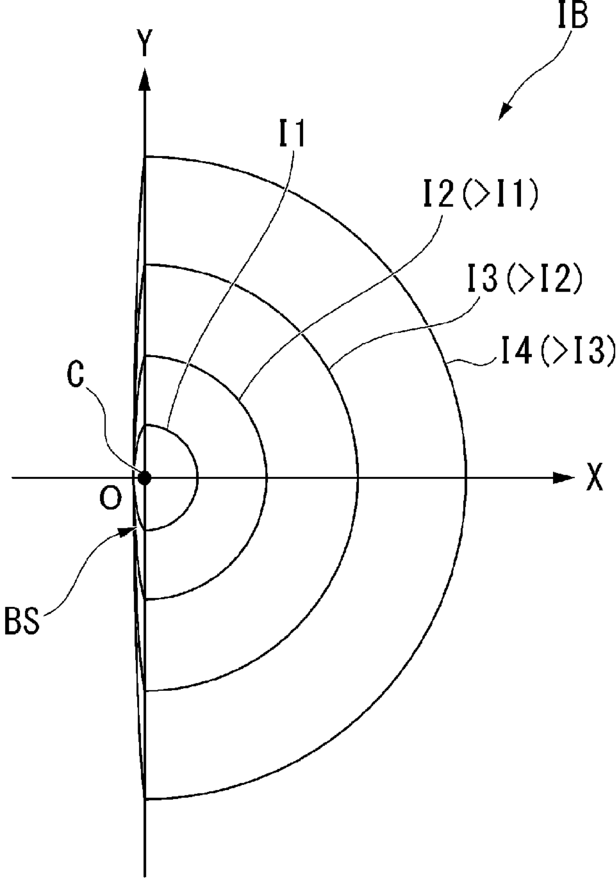
FIG. 4 is a view illustrating a spot shape of an ion beam of a composite beam device according to one embodiment of the present invention.
Figure 5:
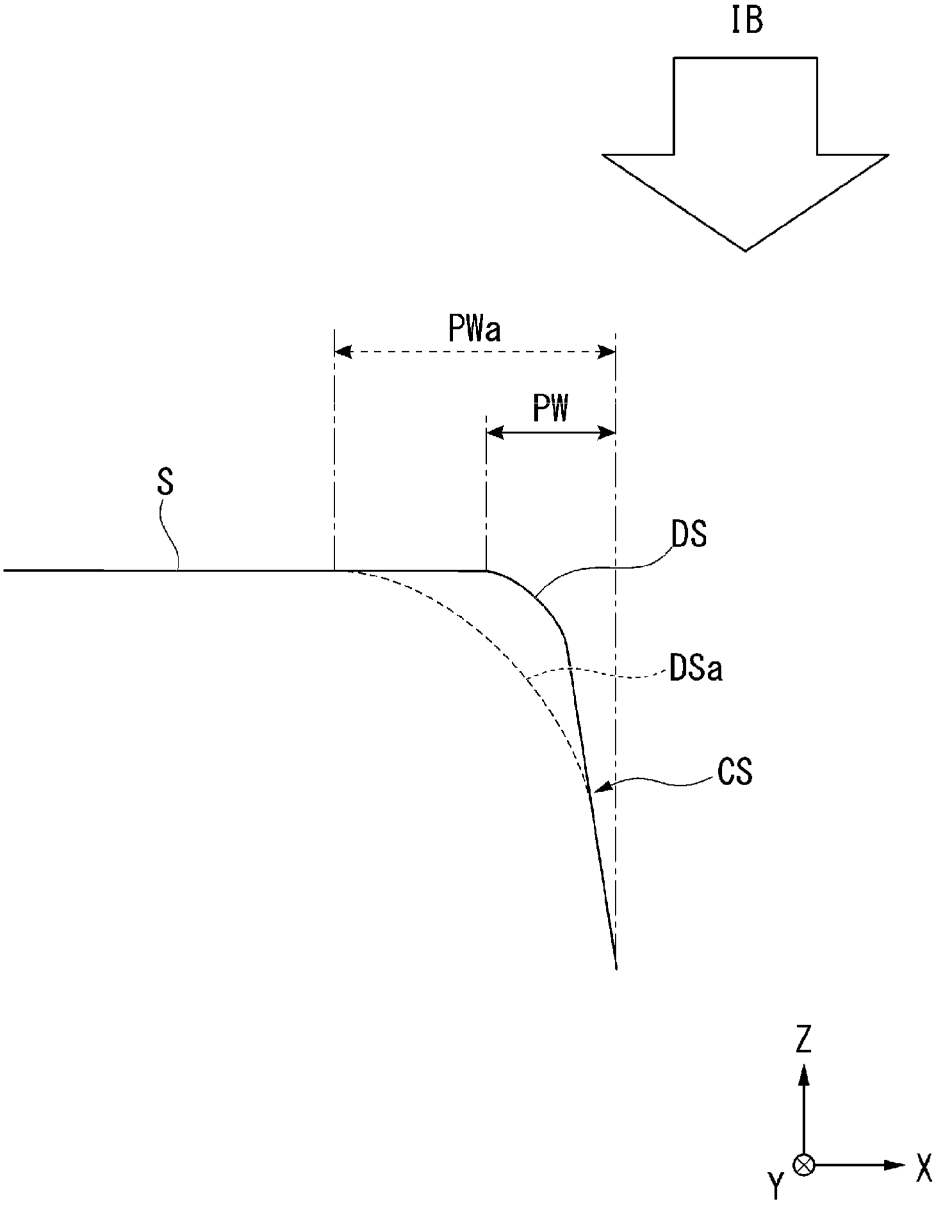
FIG. 5 is a view illustrating an example of a cross section formed by ion beam etching processing by a composite beam device according to one embodiment of the present invention.

FIG. 3 is a view illustrating an example of the correspondence between an ion beam (IB) and a blocking member 54*b* and diaphragm member 55*b* of the ion beam column 17. FIG. 4 is a view illustrating an example of a spot shape of an ion beam (IM) of the composite beam device according to one embodiment. FIG. 5 is a view illustrating an example of a cross section formed by ion beam (IB) etching processing by the composite beam device according to one embodiment.

As illustrated in FIG. 3, the spread angle (second beam half angle) $\alpha 2$ of the ion beam that is partially blocked by the blocking member 54*b* is smaller than the spread angle $\alpha 1$ (first beam half angle) of the ion beam that is condensed by the diaphragm member 55*b* without blocking the ion beam by the blocking member 54*b*.

For example, as shown in Equation 1 below, the minimum beam diameter d of the ion beam focused on the sample S is described by the optics magnification M, the virtual ion source diameter $\rho$, the spherical aberration coefficient $C_s$, the chromatic aberration coefficient $C_c$, the beam half angle $\alpha$, the energy width $\Delta V$ of the emitted ions, and the beam energy V of the emitted ions.

[Equation 1]

$$d = 2\sqrt{\left(M \cdot \frac{\rho}{2}\right)^2 + \left(\frac{1}{4} C_s \cdot \alpha^3\right)^2 + \left(\frac{1}{2} C_c \cdot \alpha \cdot \frac{\Delta V}{V}\right)^2} \quad (1)$$

In the root (√) of the Equation 1 above, the first term is the size of the image formed on the sample S at the emission point of the ion source, the second term is the amount of image blurring due to spherical aberration, and the third term is the amount of image blurring due to chromatic aberration. The second and third terms depend on the beam half angle $\alpha$. As the beam half angle $\alpha$ decreases, the blurring amount decreases. In other words, the beam half-angle $\alpha$ of the ion beam decreases from the first beam half angle $\alpha 1$ to the second beam half angle $\alpha 2$ ($<\alpha 1$) depending on whether the beam is blocked by the blocking member 54*b*, thereby reducing the amount of image blurring induced due to spherical aberration and the amount of image blurring induced due to chromatic aberration on the second beam half angle $\alpha 2$ side.

For example, the spot shape of the ion beam shown in FIG. 4 is the spot shape when the cross-sectional shape relative to the optical axis is shaped into a semicircle by the blocking member 54*b* for each of the ion beam currents I1, I2, I3, I4 of respectively different magnitudes. The beam surface BS formed by one knife-edge-shaped end 54*c* of the blocking member 54*b* is substantially planar, and the amount of image blur caused by each of spherical and chromatic aberrations is reduced, so that the spread of the ion beam is reduced. When the position of the knife-edge-shaped end 54*c* is adjusted to be aligned with the beam center C, the second beam half angle $\alpha 2$ can be almost zero, which eliminates the amount of image blur caused by spherical aberration and chromatic aberration in the beam surface BS.

For example, the beam current I4 shown in FIG. 4 is 40 nA. In the Y-axis direction, the image is expanded due to the amount of blurring caused by spherical and chromatic aberrations, but in the X-axis direction, the expansion of the image to the negative side of the X-axis from the origin is suppressed. Therefore, it is possible to process a vertical flat surface with a sharp edge at high current.

For example, the cross-section CS of the sample S shown in FIG. 5 illustrates examples of the processing width PW and the shear-droop surface DS obtained, in the example, by etching processing performed with an ion beam with the beam surface BS formed by the blocking member 54*b*, and the processing width PWa and the shear-droop surface DSa obtained, in the comparative example, by etching processing performed with an ion beam that is not blocked by the blocking member 54*b*. The processing width PW and the shear-droop surface DS in the example are smaller than the processing width PWa and the shear-droop surface DSa in the comparative example due to the reduced ion beam spread compared to that of the comparative example. The steepness of the shear-droop surface DS in the example is higher than the steepness of the shear-droop surface DSa in the comparative example.

Observation and Processing Process

Hereinafter, an example of the operation of the composite beam device 10 for observation and processing of a sample S will be described.

In a first operation example, the control device 25 first forms an ion beam with a circular cross-sectional shape with respect to the optical axis using the circular hole of the movable diaphragm 55 without blocking the ion beam with the movable blocking unit 54. The control device 25 acquires images for observation (observation images) by scanning the surface of the sample S by applying an ion beam at a relatively small current. The control device 25 sets the processing area and processing conditions on the observation image.

Next, the control device 25 forms an ion beam having an arched or semi-circular cross-sectional shape with respect to the optical axis by blocking a portion of the ion beam with the movable blocking unit 54. The control devices 25 changes the optical conditions such as lens voltage in the ion optics 42 and the settings of the movable diaphragm 55 to a relatively large or medium current, and causes the electrostatic deflector 60 to perform predetermined preset operations such as correction of the irradiation position caused by the beam current change, and then performs etching processing on the sample S by irradiation of a relatively large or medium current ion beam.

In a second operation example, the control device 25 forms an ion beam with a circular cross-sectional shape with respect to the optical axis using the circular hole of the movable diaphragm 55 without blocking the ion beam with the movable blocking unit 54 after completion of the predetermined coarse processing. The control device 25 acquires images for observation (observation images) by scanning the surface of the sample S by applying a medium current ion beam when the damage to the surface of the sample S caused by irradiation with a relatively medium-current ion beam can be neglected. The control device 25 sets the processing area and processing conditions on the observation image.

Next, the control device 25 forms an ion beam having an arched or semi-circular cross-sectional shape with respect to the optical axis by blocking a portion of the ion beam with the movable blocking unit 54. The control unit 25, for example, etches the sample S by applying a medium current ion beam as in the case of observation.

In a third operation example, the control device first forms an ion beam with a circular cross-sectional shape with respect to the optical axis using the circular hole of the movable diaphragm 55 without blocking the ion beam with the movable blocking unit 54. The control device 25 scans the surface of the sample S by applying a relatively small or medium current ion beam to the sample S, to acquire an image (observation image) for observing a reference mark indicating a reference point preliminarily formed on the surface of the sample S. The control device 25 corrects the misalignment of the sample S as necessary on the basis of the position coordinates of the reference mark on the observation image.

Next, the control device 25 forms an ion beam having an arched or semi-circular cross-sectional shape with respect to the optical axis by blocking a portion of the ion beam with the movable blocking unit 54. The control devices 25 changes the optical conditions such as lens voltage in the ion optics 42 and the settings of the movable diaphragm 55 to a relatively large or medium current, and causes the electrostatic deflector 60 to perform predetermined preset operations, for example, such as correction of the irradiation position caused by the beam current change, and then performs etching processing on the sample S by applying a relatively large or medium current ion beam to the sample S during a drift correction interval for the sample S. For the drift correction, the control device 25 forms an ion beam with a circular cross-sectional shape with respect to the optical axis using the circular hole of the movable diaphragm 55 without blocking the ion beam with the movable blocking unit 54. The control device 25 scans the surface of the sample S to acquire an image (observation image) for observing the reference mark indicating the reference point preliminarily formed on the surface of the sample S. The control device 25 corrects the misalignment of the sample S as necessary on the basis of the position coordinates of the reference mark on the observation image.

Next, the control device 25 repeats the observation image acquisition and the misalignment correction and the etching process that are described above until the processing region reaches the desired position.

In a fourth operation example, the control device 25 adjusts the beam current by, for example, changing the amount of the ion beam that is blocked by the movable blocking unit 54 according to the processing contents in a state in which the beam current is set to the maximum current because the beam current decreases when part of the ion beam is blocked by the movable blocking unit 54.

For example, the control device 25 sets the blocking amount to 20% for rough processing, to 50% for intermediate processing, and to 80% for finishing processing, relative to the maximum beam current. This means that, for example, when the maximum beam current is 80 nA, the beam current for rough processing is 64 nA, the beam current for intermediate processing is 40 nA, and the beam current for finishing processing is 16 nA. The control device 25 may adjust the beam current in more precisely by precisely changing the position of the blocking member 54*b* of the movable blocking unit 54.

By causing the blocking member 54*b* to block the ion beam passing through the through-hole positioned at the beam center C, the sample S can be processed by the beam center at which the beam current is relatively large.

With the use of the ion beam passing through the circular hole of the diaphragm member 55*b* while the ion beam is not blocked by the blocking member 54*b*, an appropriate image for observation can be obtained, so that highly accurate positioning for both observation and processing can be achieved.

With the use of the ion beam with an arched or semi-circular cross-sectional shape that is formed by the blocking member 54*b*, it is possible to easily form a cross-sectional shape with a linear edge. Since it is possible to reduce the image blurs attributable to spherical and chromatic aberrations, the finishing width can be reduced, the processing time is reduced, and efficient cross-section processing can be performed.

For example, even though the aberration increases when the through-hole 55*c* of the diaphragm member 55*b* is increased to secure the desired beam current with a relatively low current density, the steepness of the edge of the cross-sectional shape formed by the processing can be secured.

A portion that is the end 54*d* including one end 54*c* of the knife-edge-shaped end 54*c* of the blocking member 54*b* to block a portion of the ion beam is parallel to the second driving direction (for example, Y-axis direction) of the blocking drive mechanism 54*a*. Therefore, the portion (irradiated with the ion beam) of the blocking member 54*b* that blocks the ion beam can be displaced along the second driving direction of the blocking drive mechanism 54*a*, and thus the lifespan of the blocking member 54*b* can be increased. That is, the replacing cycle of the blocking member 54*b* can be extended.

Modification

Hereinafter, a modification to the embodiment will be described. The same parts as those in the embodiment described above will be given the same reference symbols, and the description thereof will be omitted or simplified.

In the embodiment described above, the outer shape of the blocking member 54*b* is described to be a rectangular plate shape, but the shape is not limited to the rectangular plate shape and may be any plate shape other than the rectangular plate shape.

In the above-described embodiment, at least one end 54*c* of the blocking member 54*b* in the lateral direction has a knife-edge shape extending along the longitudinal direction, but the present invention is not limited thereto. For example, the blocking member 54*b* may have multiple ends to block the ion beam.

Figure 6:
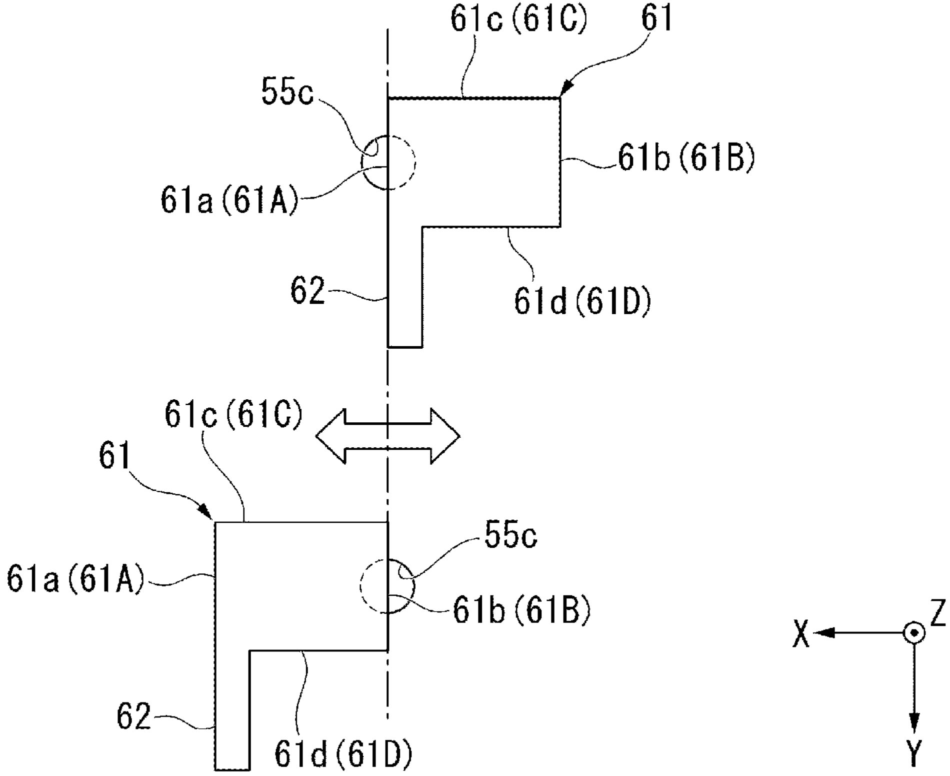
FIG. 6 is a view illustrating a first example of movement of the shielding member in a modification to the embodiment of the present invention.
Figure 7:
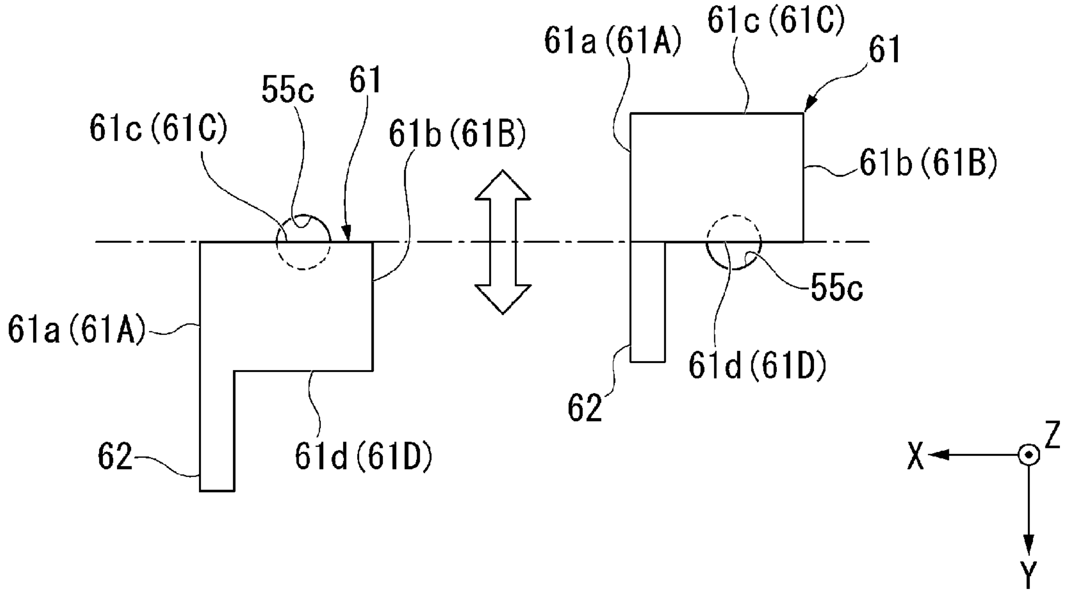
FIG. 7 is a view illustrating a second example of movement of the shielding member in a modification to the embodiment of the present invention.

FIGS. 6 and 7 are views illustrating first and second movement examples of the blocking member 61 in a modification to the embodiment.

Referring to FIGS. 6 and 7, the outer shape of the blocking member 61 in the modification is a rectangular plate shape provided with a shaft 62 connected to the blocking drive mechanism 54*a*. The blocking member 61 in the modification has knife-edge-shaped first and second ends 61*a* and 61*b* that extend linearly along the second driving direction (for example, Y-axis direction) and which are ends in the first driving direction (for example, X-axis direction) of the blocking drive mechanism 54*a*. The blocking member 61 has knife-edge-shaped third and fourth ends 61*a* and 61*d* that extend linearly along the first driving direction (for example, X-axis direction) and which are ends in the second driving direction (for example, Y-axis direction) of the blocking drive mechanism 54*a*.

Referring to FIG. 6, the blocking member 61 is displaced in the X-axis direction by the blocking drive mechanism 54*a*, so that a portion of the ion beam (IB) passing through the through-hole 55*c* is blocked by either of the ends 61A and 61B respectively including the knife edge-shaped first and second ends 61*a* and 61*b*.

Referring to FIG. 7, the blocking member 61 is displaced in the Y-axis direction by the blocking drive mechanism 54*a*, so that a portion of the ion beam (IB) passing through the through-hole 55*c* is blocked by either of the ends 61C and 61D respectively including the knife edge-shaped third and fourth ends 61*c* and 61*d*.

According to this modification, for example, during the cross-section processing such as forming a lamella, the direction (orientation) of the substantially planar beam surface BS of the ion beam formed by the blocking member 61 and the direction (orientation) of the cross section of the sample S formed by the beam surface BS can be changed.

In the embodiment described above, by displacing the blocking member 54*b* of the movable blocking unit 54 in a state in which the center of the desired circular hole in the movable diaphragm 55 is aligned with the beam center C, an ion beam with an arched or semi-circular cross-sectional shape with respect to the optical axis is formed. However, but the present invention is not limited thereto.

For example, the center of the desired circular hole in the movable diaphragm 55 may be positioned off the beam center C. In this case, when the ion beam is to be blocked by the movable blocking unit 54, one knife-edge-shaped end 54*c* of the blocking member 54*b* may be positioned to intersect the beam center C. In this case, even though the cross-sectional shape of the ion beam with respect to the optical axis is not a semi-circular shape but an arc shape, a cross section of the sample S can be formed by the beam center at which the ion beam current is relatively large.

In addition, in the embodiment-described above, the position of the diaphragm member 55*b* of the movable diaphragm 55 is unchanged during the observation process in which the ion beam is not blocked by the movable blocking unit 54 and during the processing process in which the ion beam is partially blocked by the movable blocking unit 54. However, the present invention is not limited thereto. The position of the diaphragm member 55*b* can be changed when the observation mode and the processing mode are switched so that the bean current can be adjusted.

In the embodiment described above, the movable blocking unit 54 is positioned upstream of the movable diaphragm 55, but the present invention is not limited thereto. The movable blocking unit 54 can be positioned downstream of the movable diaphragm 55.

In the embodiment described above, the composite beam device 10 is equipped with the electron beam column 15 and the ion beam column 17, but the present invention is not limited thereto. For example, the composite beam device 10 may not be equipped with the electron beam column 15 but may be equipped with only the ion beam column 17.

The embodiments of the invention are presented for illustrative purposes and are not intended to limit the scope of the invention. These embodiments can be implemented in various other forms, and various omissions, substitutions, and changes can be made without departing from the gist of the invention. These embodiments and modifications thereto fall within the scope and idea of the inventions and also fall within the scopes of the inventions defined in the claims and their equivalents.

EXPLANATION OF REFERENCE NUMERALS

10 . . . Composite beam device, 11 . . . Sample chamber, 12 . . . Sample holder, 13 . . . Sample stand, 15 . . . Electron beam column, 17 . . . Ion beam column, 21 . . . Secondary charged particle detector, 23 . . . Gas supply unit, 25 . . . Control device, 27 . . . Input device, 29 . . . Display device, 41 . . . Ion source, 42 . . . Ion optics, 52 . . . Condenser lens, 53 . . . Blanker, 54 . . . Movable shielding unit, 55 . . . Movable diaphragm member, 54*a* . . . Shielding drive mechanism (drive mechanism), 54*b* . . . Shielding member, 54*c* . . . First end, 54*d* . . . End, 55 . . . Movable diaphragm, 55*a* . . . Diaphragm drive mechanism, 55*b* . . . Diaphragm member, 55*c* . . . Through-hole, 56 . . . Alignment, 57 . . . Stigmeter, 58 . . . Scanning electrode,

59 . . . Objective lens, 61 . . . Shielding member, 61*a* . . . First end, 61*b* . . . Second end, 61*c* . . . Third end, 61*d* . . . Fourth end, 61A, 61B, 61C, 61D . . . Ends, IB . . . Ion beam, C . . . Beam center, S . . . Sample.

The invention claimed is:

1. A focused ion beam device comprising:

an ion source generating an ion beam;

a diaphragm member with at least one through-hole, which is selected to allow to pass a portion of the ion beam generated by the ion source through;

a blocking member blocking a portion of the ion beam passing through the through-hole of the diaphragm member;

a drive mechanism driving the blocking member; and an optics irradiating a sample with the ion beam passing through the through-hole, wherein the drive mechanism drives a switch between presence and absence of blocking of the ion beam passing through the through-hole of the diaphragm member by the blocking member in a state in which the optics maintains a predetermined optical condition, the drive mechanism drives a switch between presence and absence of blocking of the ion beam passing through the through-hole placed at a central portion of the ion beam by the blocking member, the through-hole of the diaphragm member has a circular outer shape, the blocking member has an end with an edge extending in a linear direction, and the drive mechanism switches a cross-sectional shape of the ion beam with respect to a beam axis between an arch or semi-circular shape and a circular shape by driving a switch between presence and absence of blocking of the ion beam passing through the through-hole by the end, the focused ion beam device further comprises a control device that controls movement of the ion source, the diaphragm member, the blocking member, and the drive mechanism, the control device is capable of performing a first operation, in the first operation, the control device forms the ion beam with a circular cross-sectional shape with respect to the beam axis by aligning a central portion of the through-hole of the diaphragm member to a central portion of the ion beam without blocking the ion beam with the blocking member and acquires images for observation by scanning the sample with the ion beam, next, the control device forms the ion beam with an arc-shaped or semi-circular cross-sectional shape with respect to the beam axis by blocking a portion of the ion beam with the blocking member while maintaining identical optical conditions in the optics to optical conditions when the images for observation are acquired and processes the sample.

2. The focused ion beam device according to claim 1, wherein when the drive mechanism, in case the ion beam passing through the through-hole is blocked by an end of the blocking member, places the end of the blocking member at a central portion of the ion beam.

3. The focused ion beam device according to claim 1, wherein the drive mechanism drives a switch between presence and absence of blocking of the ion beam passing through the through-hole by each of both ends in a driving direction by driving the blocking member in at least one axial direction forward or backward.

4. The focused ion beam device according to claim 2, wherein the drive mechanism drives a switch between presence and absence of blocking of the ion beam passing through the through-hole by each of both ends in a driving direction by driving the blocking member in at least one axial direction forward or backward.

5. The focused ion beam device according to claim 1, wherein the control device is capable of performing a second operation, in the second operation, the control device forms the ion beam with a circular cross-sectional shape with respect to the beam axis by aligning a central portion of the through-hole of the diaphragm member to a central portion of the ion beam without blocking the ion beam with the blocking member and acquires images for observation by scanning the sample with the ion beam, next, the control device forms the ion beam with an arc-shaped or semi-circular cross-sectional shape with respect to the beam axis by changing optical condition in the optics from optical conditions when the images for observation are acquired, performing predetermined preset operations accompanying changes in optical conditions in the optics, and blocking a portion of the ion beam with the blocking member and processes the sample.

6. The focused ion beam device according to claim 2, wherein the control device is capable of performing a second operation, in the second operation, the control device forms the ion beam with a circular cross-sectional shape with respect to the beam axis by aligning a central portion of the through-hole of the diaphragm member to a central portion of the ion beam without blocking the ion beam with the blocking member and acquires images for observation by scanning the sample with the ion beam, next, the control device forms the ion beam with an arc-shaped or semi-circular cross-sectional shape with respect to the beam axis by changing optical condition in the optics from optical conditions when the images for observation are acquired, performing predetermined preset operations accompanying changes in optical conditions in the optics, and blocking a portion of the ion beam with the blocking member and processes the sample.

7. The focused ion beam device according to claim 3, wherein the control device is capable of performing a second operation, in the second operation, the control device forms the ion beam with a circular cross-sectional shape with respect to the beam axis by aligning a central portion of the through-hole of the diaphragm member to a central portion of the ion beam without blocking the ion beam with the blocking member and acquires images for observation by scanning the sample with the ion beam, next, the control device forms the ion beam with an arc-shaped or semi-circular cross-sectional shape with respect to the beam axis by changing optical condition in the optics from optical conditions when the images for observation are acquired, performing predetermined preset operations accompanying changes in optical conditions in the optics, and blocking a portion of the ion beam with the blocking member and processes the sample.

8. The focused ion beam device according to claim 4, wherein the control device is capable of performing a second operation, in the second operation, the control device forms the ion beam with a circular cross-sectional shape with respect to the beam axis by aligning a central portion of the through-hole of the diaphragm member to a central portion of the ion beam without blocking the ion beam with the blocking member and acquires images for observation by scanning the sample with the ion beam, next, the control device forms the ion beam with an arc-shaped or semi-circular cross-sectional shape with respect to the beam axis by changing optical condition in the optics from optical conditions when the images for observation are acquired, performing predetermined preset operations accompanying changes in optical conditions in the optics, and blocking a portion of the ion beam with the blocking member and processes the sample.

* * * * *